United States Patent
Rudrud et al.

(12) 
(10) Patent No.: US 7,525,299 B1
(45) Date of Patent: Apr. 28, 2009

(54) APPARATUS FOR ACCESSING AND PROBING THE CONNECTIONS BETWEEN A CHIP PACKAGE AND A PRINTED CIRCUIT BOARD

(75) Inventors: Paul W. Rudrud, Rochester, MN (US); Roger A. Booth, Jr., Wappingers Falls, NY (US); John R. Dangler, Rochester, MN (US); Matthew S. Doyle, Rochester, MN (US); Jesse M. Hefner, Rochester, MN (US); Ankur K. Patel, Rochester, MN (US); Thomas W. Liang, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/163,346

(22) Filed: Jun. 27, 2008

(51) Int. Cl.
*G01R 31/02* (2006.01)
(52) U.S. Cl. ...................... 324/72.5; 324/761
(58) Field of Classification Search ............... None
See application file for complete search history.

(56) References Cited

U.S. PATENT DOCUMENTS

| | | | |
|---|---|---|---|
| 2,714,196 A * | 7/1955 | Melehan | 439/425 |
| 5,184,065 A * | 2/1993 | Chism | 324/754 |
| 5,500,606 A | 3/1996 | Holmes | |
| 5,639,385 A | 6/1997 | McCormick | |
| 6,222,378 B1 * | 4/2001 | Campbell et al. | 324/754 |
| 6,614,245 B1 * | 9/2003 | Endo | 324/754 |
| 7,112,983 B2 | 9/2006 | McGinnis et al. | |
| 7,372,284 B2 * | 5/2008 | Holcombe et al. | 324/754 |

* cited by examiner

*Primary Examiner*—Paresh Patel
(74) *Attorney, Agent, or Firm*—King & Spalding LLP

(57) ABSTRACT

A device to access and/or verify connections between a chip package and a printed circuit board ("PCB"), specifically within packages lacking back-side measurement access, includes a housing for insertion between the chip package and PCB. A passageway in the housing connects an entrance and an exit from the housing. The entrance is disposed on an end of the housing facing away from the chip package. The exit is disposed on a side of the housing below the chip package such that the passageway is directed at a signal path between the chip package and the PCB. A conductor disposed in the passageway is movable between a retracted position in which a contact end of the conductor is disposed within the passageway of the housing and an extended position in which the contact end of the conductor is disposed outside of the housing and in contact with the signal path.

1 Claim, 3 Drawing Sheets

APPARATUS FOR ACCESSING AND PROBING THE CONNECTIONS BETWEEN A CHIP PACKAGE AND A PRINTED CIRCUIT BOARD

TECHNICAL FIELD

The present disclosure relates generally to testing signal paths and connections between a chip package and a printed circuit board, and more particularly to an apparatus that can be inserted between a chip package and a printed circuit board to test such connections.

BACKGROUND

A chip package is the housing in which a computer chip is placed and which is soldered to a printed circuit board (hereinafter "PCB"). The chip package is soldered to the PCB at multiple, evenly-spaced locations to create multiple signal paths between the chip and the PCB (referred to herein as signal paths between the chip package and the PCB). The ability to provide more and more input/output connections to a chip that is increasingly shrinking in size is an ever-present problem. Additionally, the multiple connections between the chip package and the PCB must be tested, and the ever-decreasing size of such items can complicate that task.

One conventional method for testing the connections providing the signal paths between the chip package and the PCB includes providing vias (or holes) through a bottom surface of the PCB that allow access to the connections between the PCB and the chip package. Then, probes from a test device can be inserted into the vias to contact the connections to thereby test the signal paths between the PCB and the chip package. However, this method requires access to the back of the PCB, which may not be available for a PCB installed in a device. Additionally, this method may not provide accurate test measurements because of the test location on the underside of the PCB. Typically, specifications are developed for data signals exiting the chip package. Such signals may have different performance or characteristics if measured at the via on the opposite side of the PCB instead of at the exit of the chip package.

Another conventional test method is to connect trace wires to the connections between the PCB and the chip package during the manufacturing process and to route the trace wires outside of the profile of the chip package. Then, a test probe can be connected to the trace wires to test the connections. However, this method requires additional manufacturing cost to provide the trace wires and adversely adds length, reflections, and/or other loss to the signal path in question.

Therefore, a need exists in the art for a device for testing the signal path connections between a chip package and a PCB. Additionally, a need exists in the art for a device for testing the exit connections of a chip package when mounted to a PCB.

SUMMARY

The invention provides a device for testing the connections between a chip package and a PCB. The device comprises an insulating housing that is sized to fit between the chip package and the PCB and between rows of solder connections connecting the chip package to the PCB. A stop member of the housing prevents insertion of the housing between the solder connections beyond a desired point. A spacer may be provided on the housing to adjust the insertion distance of the housing between rows of solder connections. The housing comprises a passageway having an entrance into the housing and an exit from the housing. The entrance into the housing is disposed on the end of the housing on which the stop member is disposed, and the exit from the housing is disposed on a side of the housing at a location away from the stop member. A conducting probe is disposed in the passageway of the housing and is movable between a retracted position in which a contact end of the conductor is disposed within the passageway of the housing and an extended position in which the contact end of the conductor is disposed outside of the housing (through the exit) to contact a solder connection between the chip package and the PCB. When contacting the solder connection, the conductor provides a signal path from the connection to a location outside of a profile of the chip package for transmission to a testing device, such as an oscilloscope. A spring connected to the housing and the conductor biases the conductor to the retracted position.

These and other aspects, objects, features, and embodiments of the invention will become apparent to a person having ordinary skill in the art upon consideration of the following detailed description of exemplary embodiments exemplifying the best mode for carrying out the invention as presently perceived.

DETAILED DESCRIPTION OF EXEMPLARY EMBODIMENTS

The invention is directed to a device for testing signal path connections between a chip package and a PCB. In particular, the invention can provide a device that fits between the chip package and the PCB and between solder connections connecting the chip package to the PCB, wherein the device includes a conductor that can be positioned to contact a solder connection on one end and to provide access for connection to a testing probe on its other end.

Turning now to the drawings, in which like numerals indicate like elements throughout the figures, exemplary embodiments of the invention are described in detail.

Figure 1:
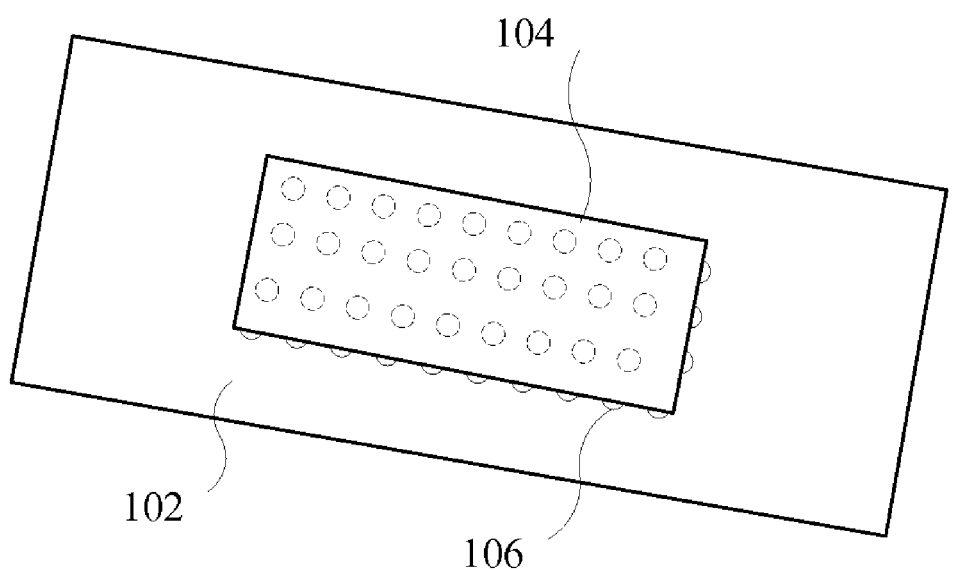
FIG. 1 is perspective view of a chip package disposed on a PCB.

FIG. 1 is perspective view of a chip package 104 disposed on a PCB 102. As illustrated in FIG. 1, the chip package 104 is soldered to the PCB 102 by multiple solder connections 106 (hereinafter referred to as "solder balls 106"). The solder balls 106 are arranged in a ball grid array via which the solder balls 106 are evenly spaced in the x and y directions. Accordingly, for a particular PCB 102 or chip package 104, the distance between the solder balls 106 in the x and y directions can be a standard distance for an industry, a particular manufacturer, or a particular PCB 102 or chip package 104.

Figure 2:
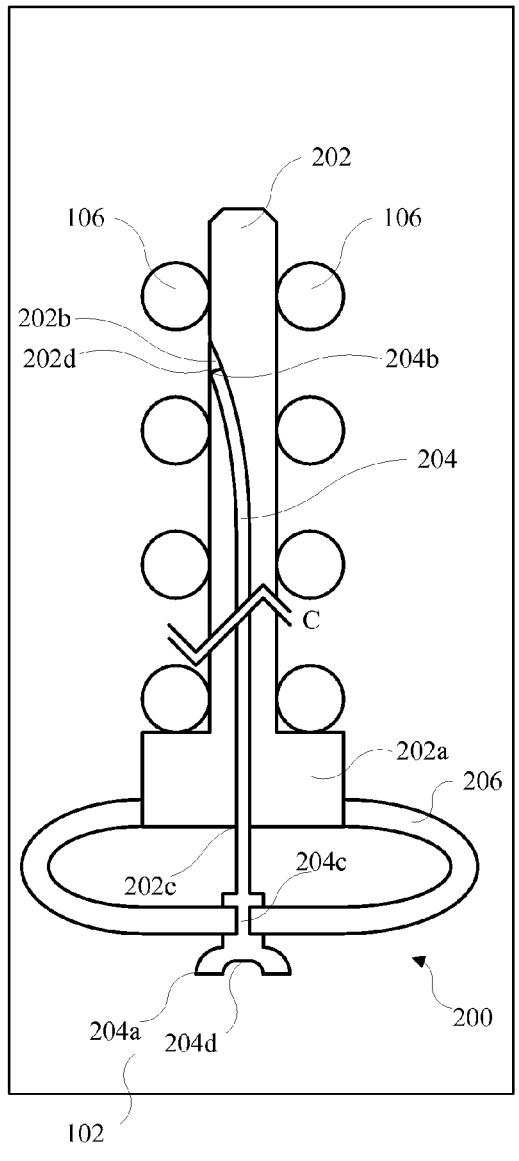
FIG. 2 is a cross-sectional view of a device for testing connections between a chip package and a PCB according to an exemplary embodiment, wherein the device is disposed in a non-testing position.
Figure 3:
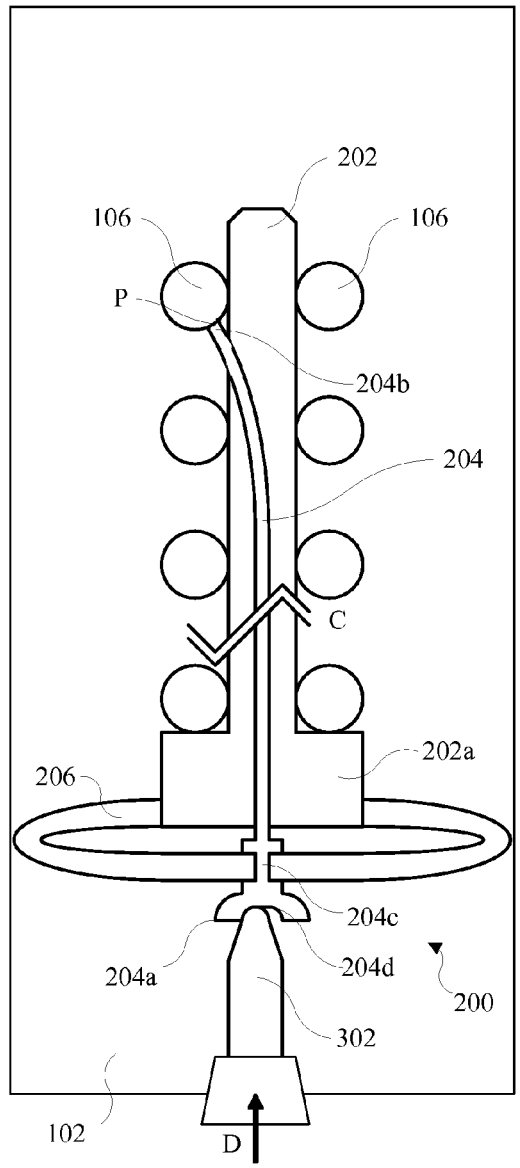
FIG. 3 is a cross-sectional view of a device for testing connections between a chip package and a PCB according to an exemplary embodiment, wherein the device is disposed in a testing position.

An exemplary testing device will be described with reference to FIGS. 2 and 3. FIG. 2 is a cross-sectional view of a device 200 for testing connections between a chip package 104 and a PCB 102 according to an exemplary embodiment, wherein the device 200 is disposed in a non-testing position. FIG. 3 is a cross-sectional view of a device 200 for testing connections between a chip package 104 and a PCB 102 according to an exemplary embodiment, wherein the device 200 is disposed in a testing position. The cross section is taken through the device 200 at a point between the chip package 104 and the PCB 102. Accordingly, only the solder balls 106 and the PCB 102 are illustrated in FIGS. 2 and 3, and the chip package 104 is not visible.

The device 200 includes a housing 202 that is sized to fit between the chip package 104 and the PCB 102 and between two rows of solder balls 106 connecting the chip package 104 to the PCB 102. The housing 202 is made of a suitable non-conductive material, such as plastic.

The housing 202 comprises a stop member 202a that limits insertion of the housing 202 between the solder balls 106 when the stop member 202a contacts a first solder ball in a row of solder balls 106. As illustrated in FIGS. 2 and 3, the housing 202 comprises two stop members 202a, one on each side of the housing 202. The stop member 202a comprises a portion of the housing 202 that is wider than a width of the housing 202 that is positioned between two rows of solder balls 106.

The housing 202 further comprises a passageway 202b through the housing 202. The passageway 202b comprises an entrance 202c into the housing 202 and an exit 202d from the housing 202. The entrance 202c is positioned in the housing 202 such that the entrance 202c is directed away from the solder balls 106. The exit 202d is positioned in the housing 202 such that a path of the passageway 202b is directed toward one of the solder balls 106 at the exit 202d. Because the dimensions of a given ball grid array are known, the housing 202 can be sized and the passageway 202b can be appropriately situated such that the exit 202d of the passageway 202b is directed toward the position of one of the solder balls 106.

A conductor 204 is disposed in the passageway 202b of the housing 202. The conductor 204 comprises a contact end 204b for making contact with one of the solder balls 106. The conductor 204 also comprises a probe end 204a for making contact with a tip end 302 of a probe of a testing device (not shown), such as an oscilloscope. The probe end 204a is disposed at the entrance 202c of the housing 202, and the contact end 204b is disposed at the exit 202d of the housing 202. The conductor 204 is made of a suitable conductive material, such as copper.

The conductor 204 is movable within the passageway 202b of the housing 202 between a first position and a second position. The first position is illustrated in FIG. 2 in which the contact end 204b of the conductor 204 is entirely within the passageway 202b of the housing 202. The second position is illustrated in FIG. 3 in which the conductor 204 is pushed into the passageway 202b in the direction D such that the contact end 204b exits the housing 202 via the exit 202d and contacts one of the solder balls 106.

The device 200 further comprises a biasing member 206 that biases the probe end 204a of the conductor 204 away from the housing 202. As illustrated in FIGS. 2 and 3, the biasing member 206 comprises a leaf-type spring contacting the housing 202 on one side and contacting the conductor 204 on another side. The conductor 204 comprises a recess 204c which holds the biasing member 206. In an exemplary embodiment, the biasing member 206 can comprise an extension of the housing 202 and can be formed from the same material as the housing 202. In an alternative exemplary embodiment, the biasing member 206 can be a separate component that is coupled to the housing 206. The biasing member 202 can be formed from a non-conductive material.

The conductor 204 further comprises a probe receptacle 204d for receiving a tip end 302 of a test probe of a testing device (not shown). As illustrated in FIGS. 2 and 3, the probe receptacle 204d comprises a cup-shaped portion into which the tip end 302 of the test probe can be inserted. The probe receptacle 204d helps maintain a position of the test probe in contact with the probe end 204a of the conductor 204.

When the tip end 302 of the test probe is moved in the direction D illustrated in FIG. 3, the biasing member 206 is compressed, thereby allowing the conductor 204 to move in the direction D such that the contact end 204b of the conductor 204 exits the housing 202 in a direction toward one of the solder balls 106. The conductor 204 can be moved against the force of the biasing member 206 until the contact end 204b of the conductor 204 contacts one of the solder balls 106, thereby providing a signal conducting path from the contacted solder ball to the tip end 302 of the test probe. Accordingly, the connection of the chip package 104 to the PCB 102 can be tested at the contacted solder ball, thereby allowing testing of the connection at an exit point of the chip package 104 and at a location between the chip package 104 and the PCB 102.

When the tip end 302 of the test probe is moved in a direction opposite to the direction D illustrated in FIG. 3, the force of the biasing member 206 moves the conductor 204 in a direction opposite to the direction D, such that the contact end 204b of the conductor 204 is retracted into the passageway 202b of the housing 202 to the position illustrated in FIG. 2.

The cutaway section C illustrated in FIGS. 2 and 3 demonstrates that the device 200 can be sized as desired to reach the last solder ball in a row of solder balls 106 for a known ball grid array. Alternatively, the device 200 can be sized to reach at least the middle solder ball in a row of solder balls 106. In this case, the device 200 can be inserted from opposite sides of the chip package 104 to reach all of the solder balls 106.

Additionally, the device 200 can be sized to fit between two rows of solder balls 106 for a known ball grid array. As illustrated in FIGS. 2 and 3, the device 200 can be sized with little tolerance between the solder balls 106. Such a configuration can allow the solder balls 106 to guide insertion of the device 200 and to position the device 200 such that the exit 202d of the passageway 202b is disposed properly with regard to the solder ball to be tested. Alternatively, the device 200 can comprise a width that has a larger tolerance between the solder balls 106. In this case, the operator can align the edge of the housing 202 comprising the exit 202d of the passageway 202b along the line of solder balls 106 having the solder ball to be tested.

In alternative exemplary embodiments, other suitable types of biasing devices may be used. For example, a coil spring can be positioned around the conductor 204 between the housing 202 and the recess 204c or the probe receptacle 204d to bias the conductor 204 in a direction away from the housing 202.

The exemplary conductor 204 illustrated in FIGS. 2 and 3 comprises a square contact end 204b. However, any suitable shape of the contact end 204b may be provided. For example, the contact end 204b may comprise a point that contacts the solder ball. Alternatively, the contact end 204b may comprise a convex or concave shape. A concave shape can be formed to correspond with a round shape of the solder balls 106 to provide a larger area of connection between the conductor 204 and the solder ball being tested.

In an alternative exemplary embodiment, the biasing member 206 may be omitted. In this case, an operator may push or pull the conductor 204 within the passageway 202b of the housing 202 to position the conductor 204 as desired. Additionally, the recess 204c may be omitted.

In another alternative exemplary embodiment, the probe receptacle 204c on the probe end 204a of the conductor 204 may be omitted. In this case, the tip end 302 of the test probe may make contact with any exposed portion of the conductor 204. Alternatively, the conductor 204 may be connected directly to the test device (not shown), such as an oscilloscope, without the use of a test probe.

The exemplary embodiment illustrated in FIGS. 2 and 3 shows the passageway 202b within the housing 202 having a slight angle such that the conductor 204 enters one end of the housing 202 and exits via a side of the housing 202. However, any suitable path for the passageway 202b may be used. For example, the passageway 202b can comprise a straight path into an end of the device 200 and out a side of the device 200. Alternatively, the passage way can comprise a bend having a sharper or shallower angle than the angle illustrated in FIGS. 2 and 3.

In certain exemplary embodiments, the conductor 204 can exit the housing 202 such that the contact end 204b of the conductor 204 contacts the solder ball at a right angle. However, other geometries are suitable to provide a signal path from the solder ball being tested to the conductor 204.

Although described as a device 200 for testing solder connections between a chip package 104 and a PCB 102, the invention is not limited to testing such connections. For example, the device 200 can be used to test plug type connections of a chip package 104 that is plugged into a PCB 102.

Figure 4:
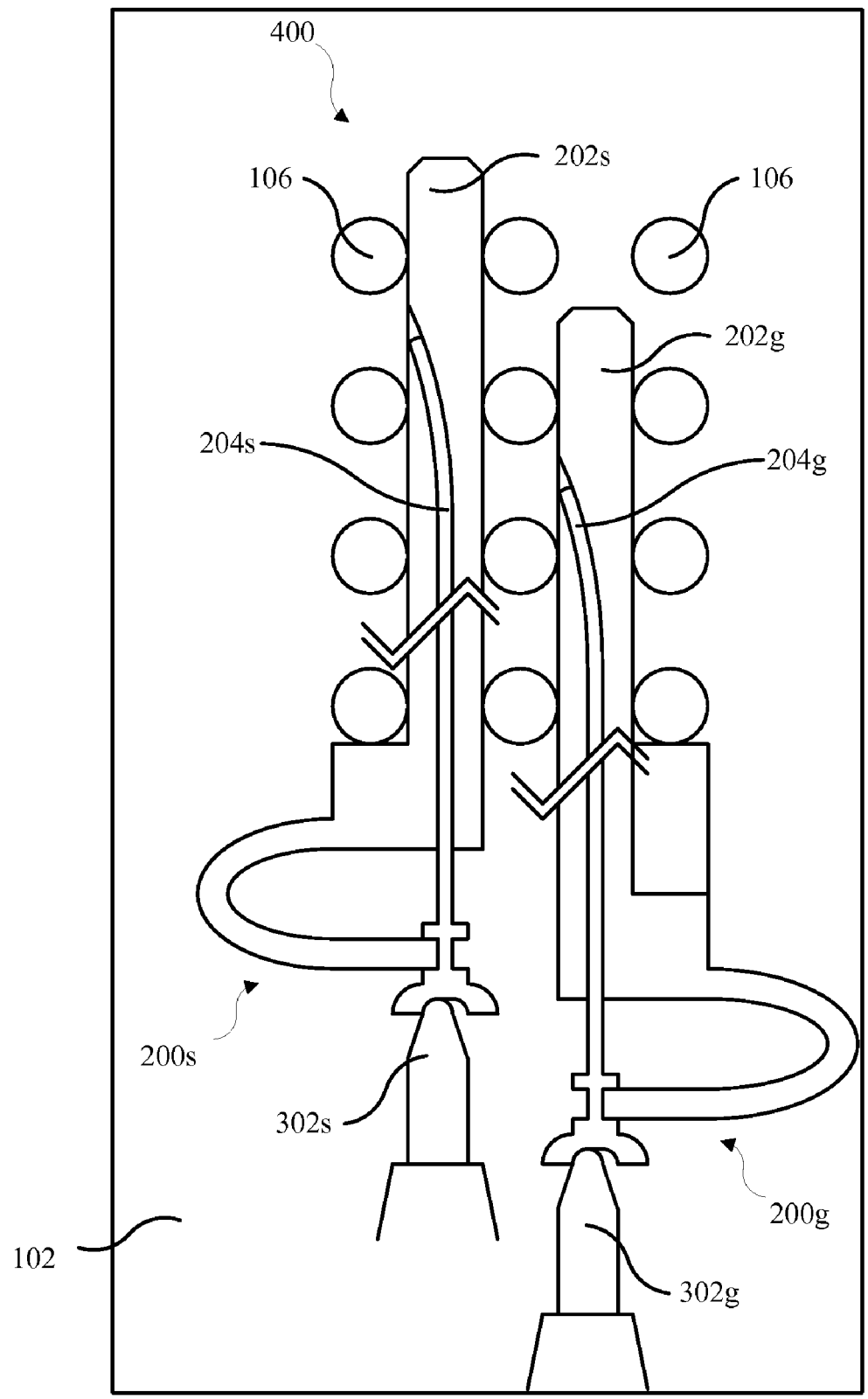
FIG. 4 is a cross-sectional view of a system for testing connections between a chip package and a PCB according to an exemplary embodiment.

FIG. 4 is a cross-sectional view of a system 400 for testing connections between a chip package 104 and a PCB 102 according to an exemplary embodiment. As illustrated in FIG. 4, the system 400 comprises a signal device 200s and a ground device 200g. The signal device 200s and the ground device 200g comprise components similar to those discussed above for the device 200 with reference to FIGS. 2 and 3. The signal device 202s is provided to test a signal from one of the solder balls 106 by contacting the solder ball with the conductor 204s, and the ground device 202g is provided to provide a ground path by contacting another one of the solder balls 106 with the conductor 204g. The exemplary embodiment illustrated in FIG. 4 is useful when the testing requires a ground return path or when a ground return path can enhance the test results for the solder ball being tested.

FIG. 4 also illustrates the use of a spacer 402 on the ground device 200g for locating the contact end 204b of the conductor 204 next to a desired one of the solder balls 106. Since the dimensions of a given ball grid array are known, suitably sized spacers 402 can be provided to dispose the contact end 204b of the conductor 204g next to any of the solder balls 106. In an exemplary embodiment, the spacer 402 can comprise a non-conductive element that clips onto the housing 202g of the device 200g. Additionally, multiple spacers can be used in series on the housing 202g to dispose the conductor 204g next to the desired one of the solder balls 106. The spacer 402 can be used with any of the exemplary devices described herein.

In an exemplary embodiment, the device 202s and the device 202g can be connected to create a combination device. For example, in an exemplary embodiment, the housings 202s and 202g can be an integral housing connected near the stop members. In an alternative exemplary embodiment, one or both of the housings 202s, 202g can be extended to connect together in a sliding relationship such that the signal conductor 204s can contact one of the solder balls 106 and the ground conductor 204g can contact another one of the solder balls 106. In an exemplary embodiment, the housings 202s, 202g can comprise complementary groove and rail connectors to provide the sliding relationship.

Thus, the exemplary embodiments described herein can allow testing of connections between a chip package 104 and a PCB 102. The exemplary devices described herein can be inserted between the chip package 104 and the PCB 102 and between rows of signal path connections between the chip package 104 and the PCB 102. Then, the conductor 204 can be moved from its retracted position to its extended position to contact one of the connections, thereby providing a signal path from the contacted connection to a point outside the profile of the chip package 104. A test probe contacting the probe end 204a of the conductor 204 can convey the signal to a testing device, such as an oscilloscope. When testing of the connection is completed, the biasing member 206 of the device 200 moves the conductor 204 from its extended position to its retracted position, and the device 200 can be removed from between the chip package 104 and the PCB 102. A spacer can be added to the device 200 to position the device 200 for testing another connection between the chip package 104 and the PCB 102.

Using the exemplary device 200 described herein can allow access to test connections between a chip package 104 and a PCB 102 even if vias are not provided on a back side of the PCB 102 and even if other test traces are not provided.

Although specific embodiments of the invention have been described above in detail, the description is merely for purposes of illustration. It should be appreciated, therefore, that many aspects of the invention were described above by way of example only and are not intended as required or essential elements of the invention unless explicitly stated otherwise. Various modifications of the disclosed aspects of the exemplary embodiments, in addition to those described above, can be made by a person of ordinary skill in the art, having the benefit of the present disclosure, without departing from the spirit and scope of the invention defined in the following claims, the scope of which is to be accorded the broadest interpretation so as to encompass such modifications and equivalent structures.

What is claimed is:

1. A device for accessing and testing connections between a chip package and a printed circuit board (PCB), comprising:
   a non-conductive housing is sized to fit between the chip Package and the PCB and between two rows of solder balls connecting the chip package to the PCB, the housing having a length from end to end that is longer than a width from side to side, the housing comprising a stop member disposed on one of its ends and a passageway extending through the housing, the stop member comprising a portion of the housing that is wider than the distance between two rows of solder balls, the stop member limits insertion of the housing between the solder balls, the passageway connecting an entrance into the housing and an exit from the housing, the entrance into the housing being disposed on the end of the housing on which the stop member is disposed, and the exit from the housing being disposed on a side of the housing at a location apart from the stop member;
   a conductor disposed in the passageway of the housing and comprising a probe end and a contact end, the conductor being movable between a retracted position in which the contact end of the conductor is disposed within the passageway of the housing and an extended position in which the contact end of the conductor is disposed outside of the housing, the probe end of the conductor extending from the housing in both the retracted and extended positions; and a non-conductive spring member connected to the housing and the conductor and biasing the conductor to the retracted position and exerting a force that must be overcome to move the conductor from the retracted position to the extended position.

* * * * *